US008912066B2

(12) United States Patent
Zhang et al.

(10) Patent No.: US 8,912,066 B2
(45) Date of Patent: Dec. 16, 2014

(54) LATERAL DOUBLE-DIFFUSED HIGH VOLTAGE DEVICE

(71) Applicant: GLOBALFOUNDRIES Singapore Pte. Ltd., Singapore (SG)

(72) Inventors: Guowei Zhang, Singapore (SG); Purakh Raj Verma, Singapore (SG)

(73) Assignee: GLOBALFOUNDRIES Singapore Pte. Ltd., Singapore (SG)

( * ) Notice: Subject to any disclaimer, the term of this patent is extended or adjusted under 35 U.S.C. 154(b) by 0 days.

(21) Appl. No.: 13/831,981

(22) Filed: Mar. 15, 2013

(65) Prior Publication Data

US 2014/0264584 A1    Sep. 18, 2014

(51) Int. Cl.
*H01L 21/336*    (2006.01)
*H01L 29/78*     (2006.01)
*H01L 29/66*     (2006.01)

(52) U.S. Cl.
CPC ...... *H01L 29/66689* (2013.01); *H01L 29/7816* (2013.01)
USPC ....................................... 438/270

(58) Field of Classification Search
CPC ............. H01L 2924/19043; H01L 29/66659; H01L 29/66681; H01L 29/66613; H01L 29/66689; H01L 29/7816
USPC ....................................... 438/270
See application file for complete search history.

(56) References Cited

U.S. PATENT DOCUMENTS

| 5,883,411 A | 3/1999 | Ueda et al. |
| 7,067,879 B1* | 6/2006 | Dyer et al. .................. 257/341 |
| 7,511,337 B2* | 3/2009 | Rouh et al. .................. 257/330 |
| 2003/0146489 A1* | 8/2003 | Shimizu .................... 257/521 |
| 2005/0145936 A1* | 7/2005 | Polzl et al. .................. 257/341 |
| 2011/0215374 A1* | 9/2011 | Lin et al. .................... 257/139 |

OTHER PUBLICATIONS

Yuanzheng Zhu et al., Folded Gate LDMOS Transistor With Low On-Resistance and High Transconductance, IEEE Transactions on Electron Devices, Dec. 2001, pp. 2917-2928, vol. 48, No. 12, IEEE.
Bernd Goebel et al., Vertical N-Channel MOSFETs for Extremely High Density Memories: The Impact of Interface Orientation on Device Performance, IEEE Transactions on Electron Devices, May 2001, pp. 897-906, vol. 48, No. 5, IEEE.

* cited by examiner

*Primary Examiner* — William D Coleman
(74) *Attorney, Agent, or Firm* — Horizon IP Pte. Ltd.

(57) ABSTRACT

A method of forming a device is disclosed. The method includes providing a substrate with a device region. The method also includes forming a transistor in the device region. The transistor includes a gate having first and second sides along a gate direction. The transistor also includes a first doped region adjacent to a first side of the gate, a second doped region adjacent to a second side of the gate, and a channel under the gate. The transistor further includes a channel trench in the channel of the gate, wherein the channel trench is along a trench direction which is at an angle θ other than 90° with respect to the gate direction.

19 Claims, 12 Drawing Sheets

LATERAL DOUBLE-DIFFUSED HIGH VOLTAGE DEVICE

CROSS-REFERENCE TO RELATED APPLICATION

This application cross-references to U.S. patent application, titled "LOW RDSON RESISTANCE LDMOS" (application Ser. No. 13/189,573; that is assigned to the same assignee as this application, which is herein incorporated by reference for all purposes.

BACKGROUND

Lateral Double-Diffused (LD) transistors have been widely employed in high voltage applications. One factor which affects the performance of the LD transistors is the gate to drain capacitance ($C_{gd}$). For example, lower $C_{gd}$ enables faster switching of LDMOS drivers.

Conventional techniques in achieving low $C_{gd}$ can result in increased drain-to-source on-resistance ($R_{dson}$), which, in turn, undesirably decreases switching speed.

The disclosure is directed to transistors with fast switching speed.

SUMMARY

A method of forming a device is disclosed. In one embodiment, the method includes providing a substrate with a device region. The method also includes forming a transistor in the device region. The transistor includes a gate having first and second sides along a gate direction. The transistor also includes a first doped region adjacent to a first side of the gate, a second doped region adjacent to a second side of the gate, and a channel under the gate. The transistor further includes a channel trench in the channel of the gate, wherein the channel trench is along a trench direction which is at an angle θ other than 90° with respect to the gate direction.

In one embodiment, a method of forming a device is disclosed. The method includes providing a substrate with a device region. The substrate includes top and bottom surfaces. The method also includes forming a transistor in the device region. The transistor includes a gate having first and second sides along a gate direction. The transistor also includes a first doped region adjacent to a first side of the gate and a second doped region adjacent to a second side of the gate. The transistor further includes a channel trench in the channel of the gate, wherein the channel trench is along a trench direction which is at an angle θ other than 90° with respect to the gate direction. The channel trench creates a channel having a first channel direction parallel to the top surface of the substrate and second channel direction along sidewalls of the channel trench.

In yet another embodiment, a semiconductor device is disclosed. The device includes a substrate having a device region. The device also includes a transistor in the device region. The transistor includes a gate having first and second sides along a gate direction. The transistor also includes a first doped region adjacent to a first side of the gate, a second doped region adjacent to a second side of the gate, and a channel under the gate. The transistor further includes a channel trench in the channel of the gate, wherein the channel trench is along a trench direction which is at an angle θ other than 90° with respect to the gate direction.

These and other advantages and features of the embodiments herein disclosed, will become apparent through reference to the following description and the accompanying drawings. Furthermore, it is to be understood that the features of the various embodiments described herein are not mutually exclusive and can exist in various combinations and permutations.

BRIEF DESCRIPTION OF THE DRAWINGS

In the drawings, like reference characters generally refer to the same parts throughout the different views. Also, the drawings are not necessarily to scale, emphasis instead generally being placed upon illustrating the principles of the invention. In the following description, various embodiments of the present invention are described with reference to the following drawings, in which.

DETAILED DESCRIPTION

Embodiments generally relate to semiconductor devices or integrated circuits (ICs). More particularly, some embodiments relate to high power devices. For example, high power devices include lateral double-diffused (LD) transistors, such as metal oxide transistors (MOS). The high power devices can be employed as switching voltage regulators for power management applications. The LD transistors can be easily integrated into devices or ICs. The devices or ICs can be incorporated into or used with, for example, consumer electronic products, and particularly portable consumer products, such as cell phones, laptop computers and personal digital assistants (PDAs).

Embodiments generally relate to devices, such as integrated circuits (ICs). In one embodiment, an IC includes a lateral double-diffused (LD) transistor, such as a metal oxide semiconductor (MOS) transistor. The LDMOS transistor, in one embodiment, may be employed in high power applications, such as switching voltage regulators for power management applications. Other uses for the LDMOS transistor may also be useful. The LDMOS transistor can be easily integrated into devices or ICs.

Figure 1A:
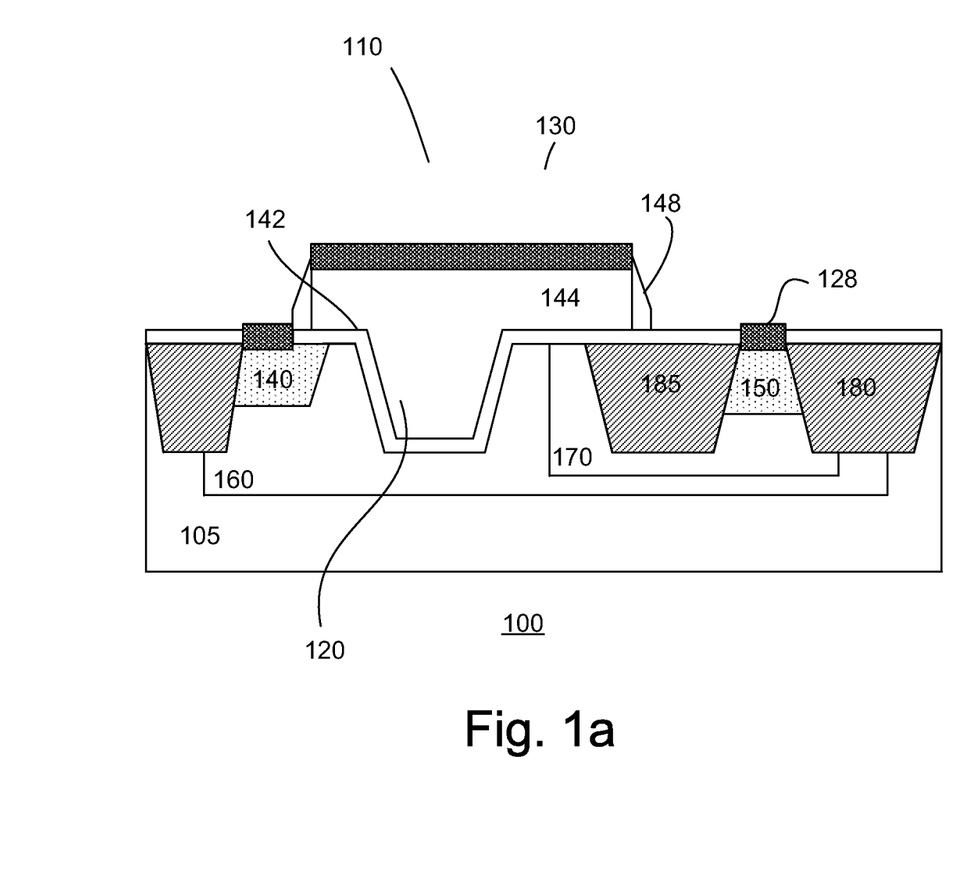
FIGS. 1a-b show cross-sectional views of embodiments of a device.
Figure 1B:
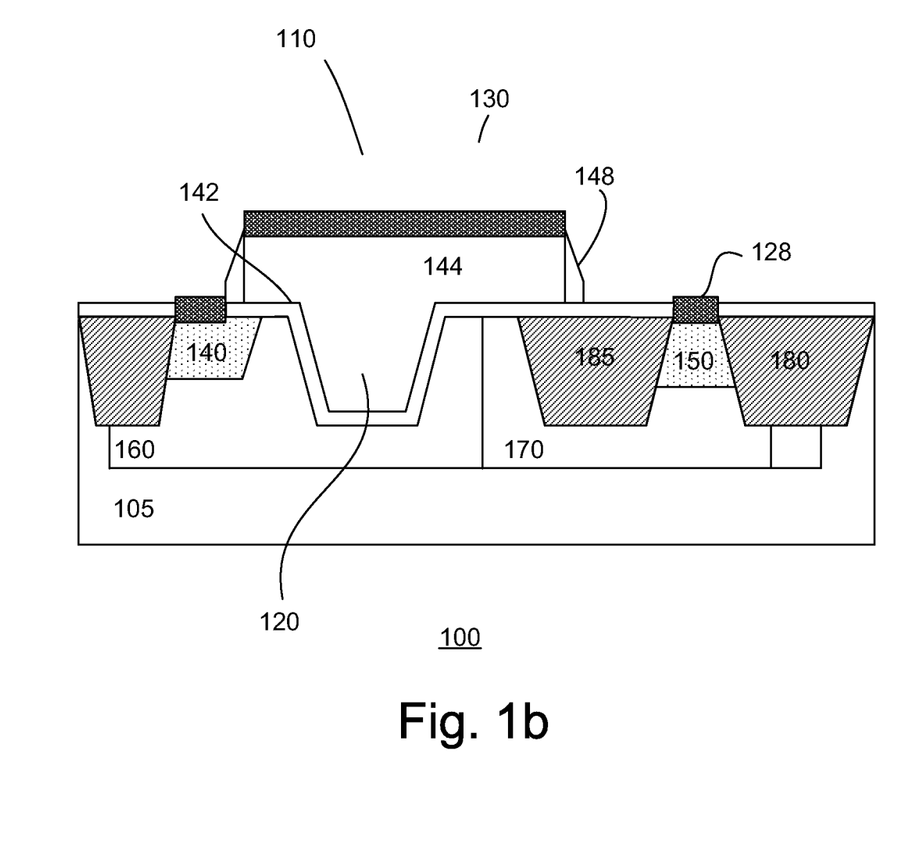

FIGS. 1a-b show cross-sectional views of embodiments of a device 100. Referring to FIG. 1a, a substrate 105 is provided. The substrate, for example, is a semiconductor substrate, such as a silicon substrate. In one embodiment, the substrate may be a p-type doped substrate. For example, the p-type doped substrate is a lightly p-type doped substrate. Other types of semiconductor substrates, including doped with other types of dopants or concentration or undoped, may also be useful. For example, the substrate may be a silicon germanium, germanium, gallium arsenide, or crystal-on-insulator (COI) such as silicon-on-insulator (SOI).

The substrate includes first and second major surfaces. For example, the substrate includes top and bottom surfaces. In one embodiment, the major surfaces are along the (100) plane. Orienting the major surfaces of the substrate along the (100) plane improves carrier mobility along the surface direction.

The device may include doped regions or wells having different dopant concentrations. For example, the device may include heavily doped, intermediate doped and lightly doped regions. The doped regions may be designated by $x^-$, $x$ and $x^+$, where x indicates the polarity of the doping, such as p for p-type or n for n-type, and:

$x^-$=lightly doped;

x=intermediate doped; and x⁺=heavily doped.

A lightly doped region may have a dopant concentration of less than about $5E13/cm^3$. For example, a lightly doped region may have a dopant concentration of about $1E11/cm^3$-$5E13/cm^3$. An intermediate doped region may have a dopant concentration from about $5E13$-$5E15/cm^3$. For a heavily doped region, it may have a dopant concentration of more than about $5E15/cm^3$. For example, a heavily doped region may have a dopant concentration from about $5E15/cm^3$-$9E15/cm^3$. Other concentrations of the different types of doped regions may also be useful. P-type dopants may include boron (B), aluminum (Al), indium (In) or a combination thereof, while n-type dopants may include phosphorus (P); arsenic (As), antimony (Sb) or a combination thereof.

As shown, the device includes a device region defined on the substrate. A device isolation region 180 may be provided for isolating or separating the device region from other device regions on the substrate. In one embodiment, the device isolation region surrounds the device region. The isolation region, for example, is a shallow trench isolation (STI) region. Other types of isolation regions may also be employed. For example, the isolation region may be a deep trench isolation (DTI) region. The isolation region, for example, extends to a depth of about 4000 Å for a STI region. Providing isolation regions which extend to other depths, such as 0.5-10 µm for DTI regions, may also be useful. In one embodiment, the width of the isolation region is about 0.3 µm. Providing isolation regions having different depths and widths may also be useful. The dimensions, for example, may depend on isolation requirements.

The substrate includes a device region. The device region, for example, is a high voltage (HV) device region for a high voltage device. In one embodiment, the device region includes a LDMOS transistor 110. The substrate may also include regions for other types of circuitry, depending on the type of device or IC. For example, the device may also include regions for intermediate voltage (IV) and low voltage (LV) voltage devices as well as an array region for memory devices.

In one embodiment, a device well 160 is disposed in the substrate in the device region. The device well, for example, serves as a body well of the transistor. The device well, as shown, encompasses the complete device region. For example, the device well extends from the bottom and between inner and outer edges of the isolation region. Other configuration of the device well may also be useful. The device well includes second polarity type dopants. For example, the device well includes second polarity type dopants for a first polarity type device. In one embodiment, the device well includes p-type dopants for a n-type device. Providing a n-type device well for a p-type device may also be useful. In one embodiment, the device well is lightly doped with second polarity type dopants. For example, the dopant concentration of the device well may be about $1E11/cm^3$-$5E13/cm^3$. Providing a device well having other dopant concentrations may also be useful. In one embodiment, the first polarity type is n-type.

A gate 130 of the transistor is disposed on the surface of the substrate in the device region. A gate may be referred to as a finger. The gate includes a gate electrode 144 disposed over a gate dielectric 142. In one embodiment, the gate dielectric is a polysilicon gate electrode. The gate electrode, in one embodiment, is about 500-5000 Å thick. Other types of gate electrode materials and thicknesses may also be useful. As for the gate dielectric, it is a silicon oxide having a thickness of about 20-600 Å. Other gate dielectric materials or thicknesses may also be useful.

The gate may be a gate conductor which forms gates of multiple transistors. For example, the gate conductor may traverse a plurality of device regions separated by isolation regions. The pluralities of transistors have a common gate formed by the gate conductor. Other configurations of gate conductors may also be useful.

The gate is disposed between first and second source/drain (S/D) regions 140 and 150. The S/D regions are first polarity type doped regions disposed in the substrate. In one embodiment, the S/D regions are heavily doped first polarity type regions for a first type transistor. For example, the S/D regions are n⁺ doped regions for a n-type device. Providing p⁺ doped regions for a p-type device may also be useful. The S/D regions, for example, have a dopant concentration of about $1E15$-$1E16/cm^2$. Other dopant concentrations for the doped regions may also be useful. The S/D regions may have a depth of about 0.1-0.4 µm. Other depths may also be useful. The S/D regions may be similar to those of other transistors of the device. In one embodiment, the first S/D region is a source region and the second S/D region is a drain region of the transistor.

In one embodiment, the first S/D region serves as a source region of the transistor. The source region is adjacent to a first side of the gate. As shown, the gate overlaps the source region. The overlap should be sufficient for the source region to be in communication with a channel of the transistor under the gate. The gate, for example, overlaps the source region by about 0.1 µm. Overlapping the source region by other amounts may also be useful. In one embodiment, the portion of the source overlapped by the gate is a lightly doped source (LDS) region. Other configurations of the first doped region may also be useful.

Sidewalls of the gate may be provided with dielectric spacers 148. The dielectric spacers, for example, may be silicon oxide spacers. Other types of dielectric materials may also be useful, such as silicon nitride or a combination of dielectric materials or layers. The spacer on the first side of the gate may facilitate forming the LDS region. Other configurations of spacers may also be useful. For example, the spacer may be a single spacer. In some cases, the transistor may also include a halo region adjacent to the source region. The halo region is second polarity doped regions abutting the source region proximate to the gate.

As for the second S/D region 150, it serves as a drain region. The drain region is displaced laterally away from a second side of the gate. The lateral displacement may be about 0.5-1 µm. Displacing the drain from the second side of the gate by other amounts may also be useful. The displacement distance may depend on, for example, the desired drift length.

In one embodiment, a drift isolation region 185 is provided between the gate and the second S/D region. The drift isolation region, for example, is a STI. Other types of drift isolation region may also be useful. As shown, the gate overlaps the drift isolation region. For example, the gate may overlap the drift isolation region by about 0.2-2 µm. Overlapping the drift isolation region by other amounts may also be useful. The drift isolation region can be employed to increase the effective drift distance to be greater than the lateral displacement. For example, the drift distance is increased due to the profile of the drift isolation region.

In one embodiment, a drift well 170 is provided in the device region. The drift well includes first polarity type dopants. In one embodiment, the dopant concentration of the drift well is lower than the dopant concentration of the drain region. In one embodiment, the drift well may be a lightly or an intermediately doped (x⁻) with first polarity type dopants. For example, the dopant concentration of the drift well is about $1E12$-$1E13/cm^2$. Other dopant concentrations may also be useful. The dopant concentration, for example, may depend on the maximum or breakdown voltage requirement of the device.

In one embodiment, the drift well is within the body well and encompasses the drain region. The drift well extends under the gate beyond the drift isolation region, creating an overlap portion of the drift well. The drift well connects the drain region to the channel of the transistor. For example, the channel is along the gate from the source to the edge of the drift well under the gate. The overlap portion should be sufficiently wide to provide the desired on resistance and drive current. In one embodiment, the overlap portion is about 0.5-1 μm. Providing other widths for the overlap portion may also be useful.

As shown, a depth of the drift well is shallower than a depth of the body well. For example, the drift well is completely within the body well. In other embodiments, a depth of the drift well may be about the same as the depth of the body well, as shown in FIG. 1b. Other configurations of the drift and body wells may also be useful.

In yet some other embodiments, a deep device well (not shown) may be disposed in the substrate. The deep device well encompasses the body and drift wells. For example, the deep device well serves as device isolation well. The deep device well may be an intermediately doped with first polarity type dopants. For example, the dopant concentration of the deep device well is about $1E12$-$1E13/cm^2$. Other dopant concentrations may also be useful.

Metal silicide contacts 128 may be formed on the gate electrode and S/D regions. For example, metal silicide contacts may be provided over the S/D regions, well contacts and gate electrode. The silicide contacts, for example, may be nickel-based contacts. Other types of metal silicide contacts may also be useful. For example, the silicide contacts may be cobalt silicide (CoSi) contacts. The silicide contacts may be about 100-500 Å thick. Other thickness of the silicide contacts may also be useful. The silicide contacts may be employed to reduce contact resistance and facilitate contact to the back-end-of-line metal interconnects.

In one embodiment, a channel trench 120 is provided in the substrate underneath the gate. Providing a transistor with more than one channel trench may also be useful. For example, a transistor may be provided with n channel trenches, where n≥1. The number of channel trenches may, for example, depend on the channel width of the transistor. In one embodiment, a transistor may be provided with about 10 channel trenches. The channel trench, for example, is located between the source and edge of the drift well. In one embodiment, the channel trench has a similar profile as the isolation regions. For example, the depth and sidewall profile of the channel trench may be the same as that of the isolation regions. The width of the channel trench may be about 0.2-1 μm. The width of the channel trench, for example, may depend on the gap fill capability of the gate electrode material. Providing a channel trench with other profiles and dimensions may also be useful.

The channel trench forms a folded gate. The gate is disposed on the substrate and fills the channel trench. For example, the gate dielectric lines the surface of the substrate and channel trench while the gate electrode is disposed over and fills the channel trench. As such, the channel width is effectively increased due to the profile of the channel trench as compared to a transistor without a folded gate. Increasing the width of the channel reduces $R_{dson}$, which increases switching speed.

In one embodiment, the channel of the folded gate includes first portions which are parallel to the major surface of the substrate and second portions which are perpendicular or substantially perpendicular to the major surface of the substrate.

In one embodiment, the channel trench is rotated at an angle θ along the channel width of the transistor. In one embodiment, the channel trench is rotated at an angle along the channel width of the transistor. The channel trench, for example, is rotated at an angle other than 90°. In one embodiment; the channel trench is rotated at an angle of about 45° (e.g., θ=45°) along the channel width of the transistor. By rotating the channel trench, the plane of the second portions of the channel is (001) instead (011) for a non-rotated channel trench, while the plane of the first portions of the channel is (010). Carrier mobility has been found to be higher in the (001) plane than the (011) plane. As such, rotating the channel trench results in further performance enhancement. Rotating the channel trench at other angles may also be useful for enhancing performance.

Figure 2:
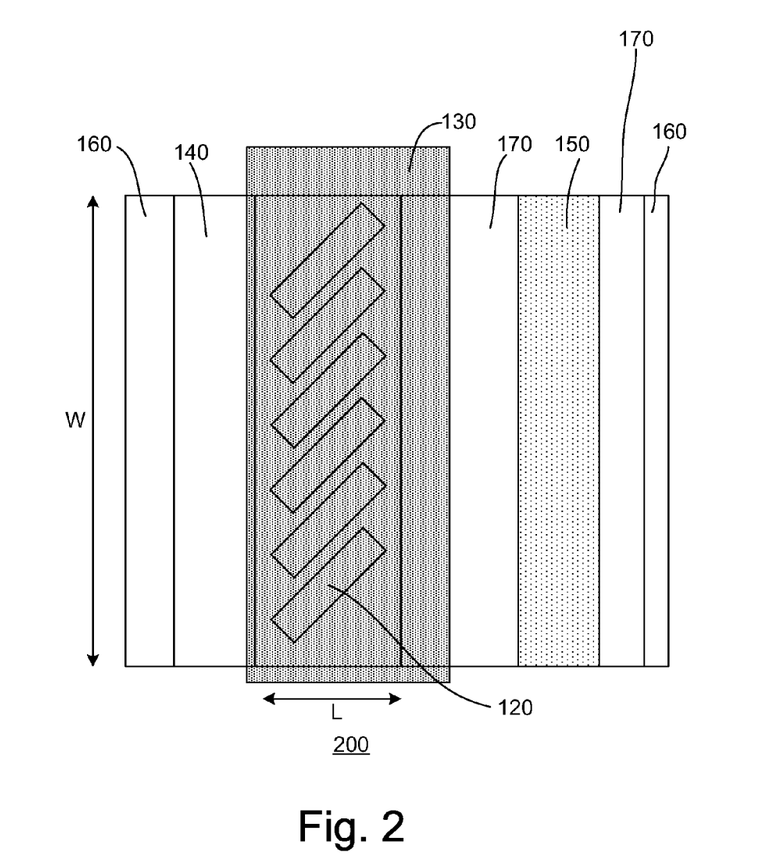
FIG. 2 shows a top view of an embodiment of a device.

FIG. 2 shows a top view of an embodiment of a device 200. The device is similar to that described in FIGS. 1a-b. As such, common elements may not be described or described in detail. The top view excludes, for example, the isolation regions. As shown, the substrate is provided with a body well 160 and drift well 170. The transistor includes a gate 130 disposed between the source 140 and drain 150. The drift well provides connection for the drain to the channel under the gate. The substrate includes n channel trenches 120 rotated 45° along the width direction W of the transistor. As shown, the transistor includes 6 (e.g., n=6) channel trenches. Providing other number of channel trenches may also be useful. Other configurations of the transistor elements may also be useful.

Figure 3A:
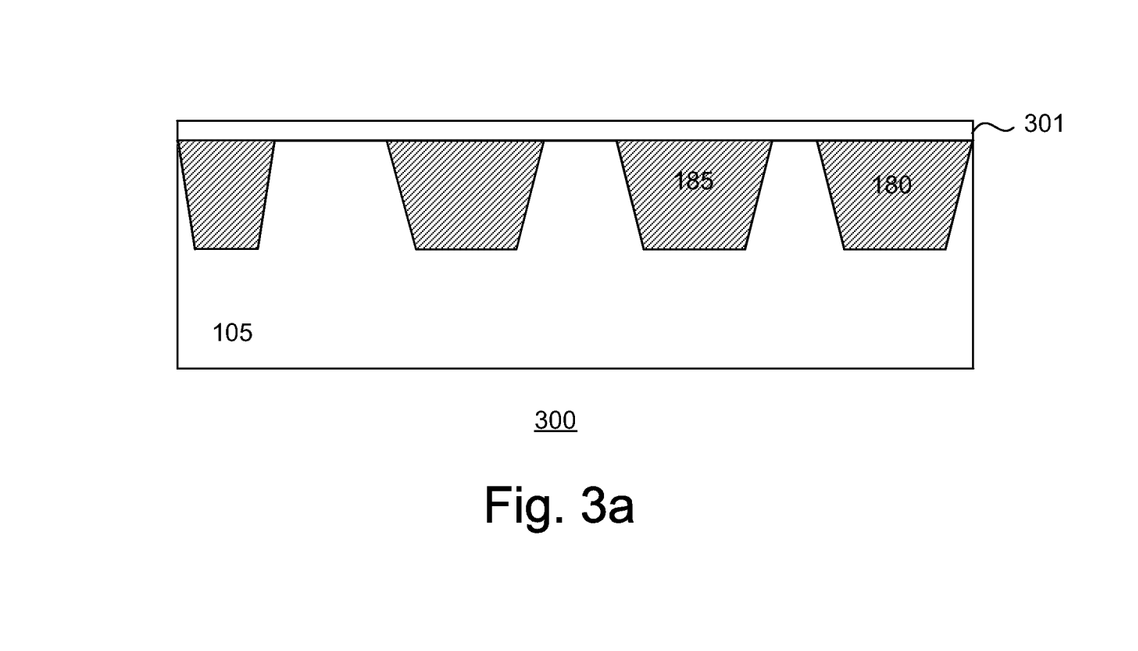
FIGS. 3a-i show an embodiment of a process for forming a device.

FIGS. 3a-i show cross-sectional views of an embodiment of a process for forming a device 300. Referring to FIG. 3a, a substrate 105 is provided. The substrate, for example, is a semiconductor substrate, such as a silicon substrate. In one embodiment, the substrate may be a p-type doped substrate. For example, the p-type doped substrate is a lightly p-type doped substrate. Other types of semiconductor substrates, including doped with other types of dopants or concentration or undoped, may also be useful. For example, the substrate may be a silicon germanium, germanium, gallium arsenide, or crystal-on-insulator (COI) such as silicon-on-insulator (SOI).

The substrate includes first and second major surfaces. For example, the substrate includes top and bottom surfaces. In one embodiment, the major surfaces are along the (100) plane. Orienting the major surfaces of the substrate along the (100) plane improves carrier mobility along the surface direction. Providing the major surfaces of the substrate along other planes may also be useful. As shown, a device region is defined on the substrate. Although one device region is shown, it is however understood that the substrate may include various types of regions (not shown). For example, the substrate may include other device regions for other types of devices. The IC may include logic regions in which logic devices are formed. Depending on the type of IC formed, the logic regions, for example, may include regions for different voltage devices. For example, the logic regions may include regions for high voltage (HV) devices, medium or intermediate voltage (IV) devices and low voltage (LV) devices.

Other configurations of logic regions may also be useful. Additionally, other types of device regions may also be provided.

In one embodiment, the device region is a HV region. The device region, for example, serves as a device region for a LD transistor. Providing a device region for other types of devices may also be useful. The device region is separated from other regions by a device isolation region 180. The device isolation region surrounds the device region.

In one embodiment, an internal device isolation region 185 is provided within the device region. The internal device isolation region serves as a drift isolation region. The drift isolation region, for example, is disposed in the device region along a channel width direction of the transistor between the gate and drain. The internal isolation region, for example, extends from one side to the other side of the device region along the channel length direction.

The isolation regions are, for example, STIs. Various processes can be employed to form the STI regions. For example, the substrate can be etched using etch and mask techniques to form trenches which are then filled with dielectric materials such as silicon oxide. Chemical mechanical polishing (CMP) can be performed to remove excess oxide and provide a planar substrate top surface. Other processes or materials can also be used to form the STIs. The depth of the STIs may be, for example, about 2000-6000 Å. Other depths for the STIs may also be useful. In other embodiments, the isolation may be other types of isolation regions. Also, the device and internal isolation regions may be different types of isolation regions.

In one embodiment, a screen oxide layer 301 is formed on the substrate. The screen oxide layer, for example, is silicon oxide. Other types of screen oxide layer may also be useful. The screen oxide layer may be formed by thermal oxidation. For example, the screen oxide layer is formed by wet oxidation followed by annealing the substrate in an oxidizing ambient. The temperature of the wet oxidation can be, for example, about 600-1000° C. The annealing can be, for example, performed at a temperature of about 1000° C. Forming other types of screen oxide layers or using other processes may also be useful.

Figure 3B:
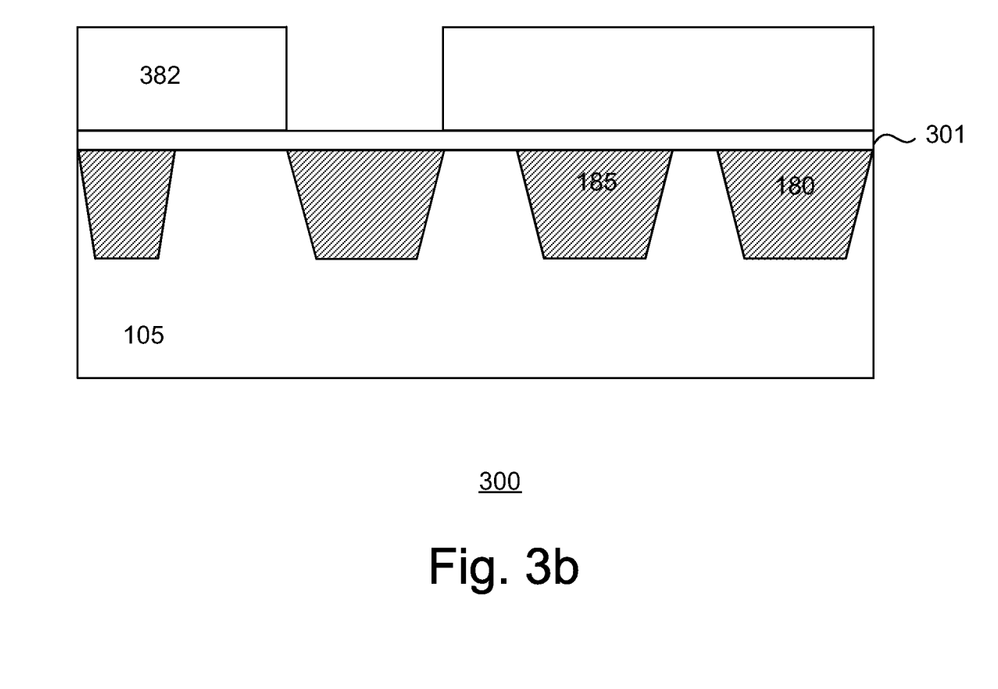

Referring to FIG. 3b, a mask layer 382 is formed on the substrate. In one embodiment, the mask layer is a soft mask layer, such as a photoresist layer. An exposure source may selectively expose the photoresist layer through a reticle containing the desired pattern. After selectively exposing the photoresist layer, it is developed to form openings corresponding to locations where channel trenches are to be formed in the substrate. In one embodiment, the openings of the mask layer correspond to locations where channel trenches are to be formed in the isolation trenches. To improve lithographic resolution, an anti-reflective coating (ARC) may be used below the photoresist layer.

Figure 3C:
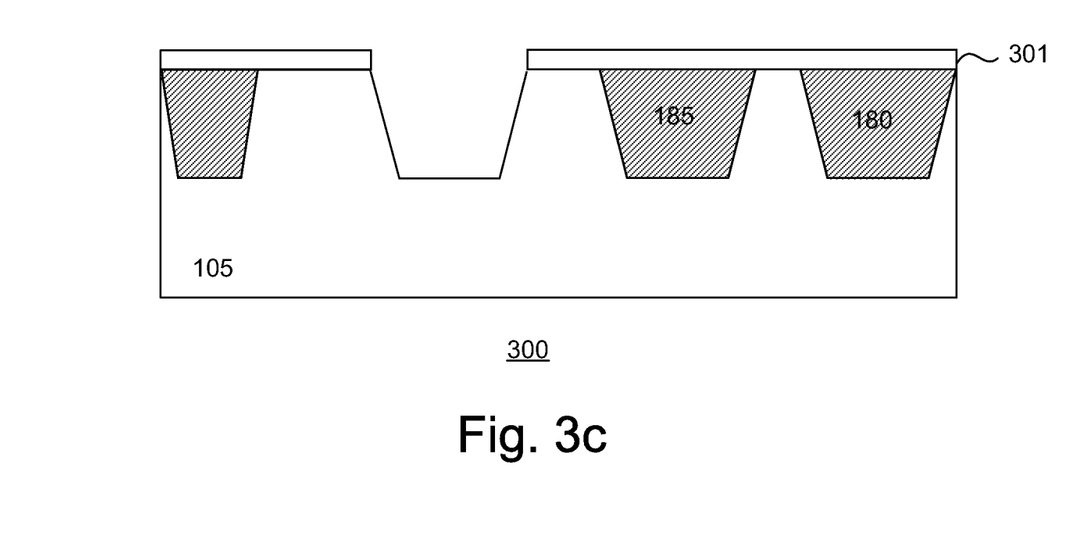

The patterned mask layer serves as an etch mask for a subsequent etch process. The etch removes the screen oxide layer and isolation region unprotected by the mask. The etch, for example, may be an anisotropic etch, such as reactive ion etch (RIE). Other types of etch processes may also be useful. In one embodiment, an RIE is employed to remove the screen oxide layer and recess the isolation region to form channel trench 120 in the isolation region, as shown in FIG. 3c. In one embodiment, the isolation region is completely recessed to form the channel trench. After the removal of the unprotected isolation region, the patterned mask layer is removed, for example, by wet etch. Other techniques for removing the patterned mask layer may also be useful.

Figure 3D:
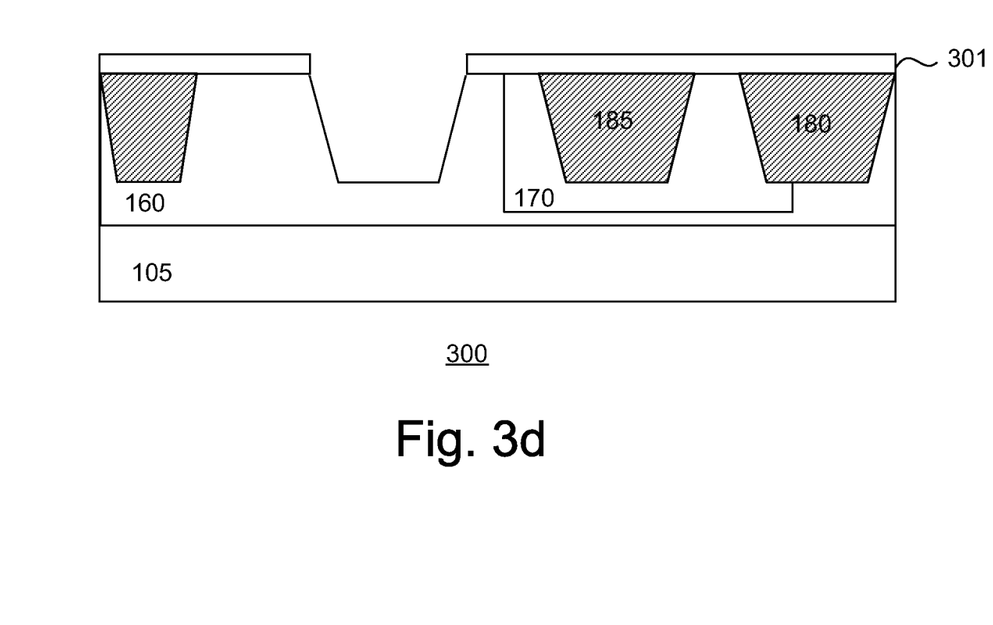

As shown in FIG. 3d, a first device well 160 and a second device well 170 are formed in the device region. The first device well serves as a body well for the device. In one embodiment, the body well encompasses the complete device region. For example, the body well extends from the bottom and between inner and outer edges of the isolation region. The depth of the body well, for example, may be about 1-5 μm. Providing a body well of other depths may also be useful. The depth of the body well, for example, may depend on the design requirements. The body well includes second polarity type dopants for a first polarity type device. For example, a p-type body well is provided for a n-type device. The p-type body well, for example, may include boron dopants. Forming a n-type body well for a p-type device may also be useful. In one embodiment, the body well may be lightly or intermediately doped with second polarity type dopants. Other dopant concentration for the body well may also be useful.

To form the body well, implant mask which exposes the device regions is used. The implant mask, for example, is a photoresist layer patterned by a lithographic mask. The implant, for example, includes implanting second polarity type dopants into the substrate.

The second device well is disposed within the body well and encompasses the drain region. The second device well serves as a drift well for the transistor. The drift well includes first polarity type dopants. In one embodiment, the depth of the drift well is shallower than a depth of the body well. For example, the drift well is completely within the body well. In one embodiment, a depth of the drift well may be about the same as the depth as the body well. Other configurations of the body and drift wells may also be useful.

To form the drift well, an implant mask which exposes the device region is used. The implant mask, for example, comprises photoresist patterned by a lithographic mask. First polarity type dopants are implanted into the substrate using the implant mask. The dopants are implanted with the appropriate dose and power. In one embodiment, the body well is formed prior to forming the drift well.

The implant processes used to form the device wells may be compatible or the same as processes used to form other similar types of wells in the device. For example, the processes may be compatible with those used in current CMOS processes for forming similar types of wells. For example, the device well may be formed at the same time as the low voltage device or intermediate voltage device well. This allows the same lithographic mask of the current CMOS implant mask to be used to pattern the implant mask for the device well. For example, the current CMOS implant mask may be customized to include the device well opening. In other embodiments, a separate device well mask may be used to specifically tailor for the doping of the device well. In such cases, the same mask can also be used to form a second device well.

An anneal is performed. In one embodiment, the anneal is performed after the body well and drift well are formed. The anneal activates the dopants. In other embodiments, separate anneals may be performed for the body well and drift well. For example, an anneal may be performed after forming a device well.

In one embodiment, the screen oxide layer 301 may be removed after the formation of the device wells. The screen oxide layer is removed, for example, by anisotropic etch. Other techniques for removing the screen oxide layer may also be useful.

Figure 3E:
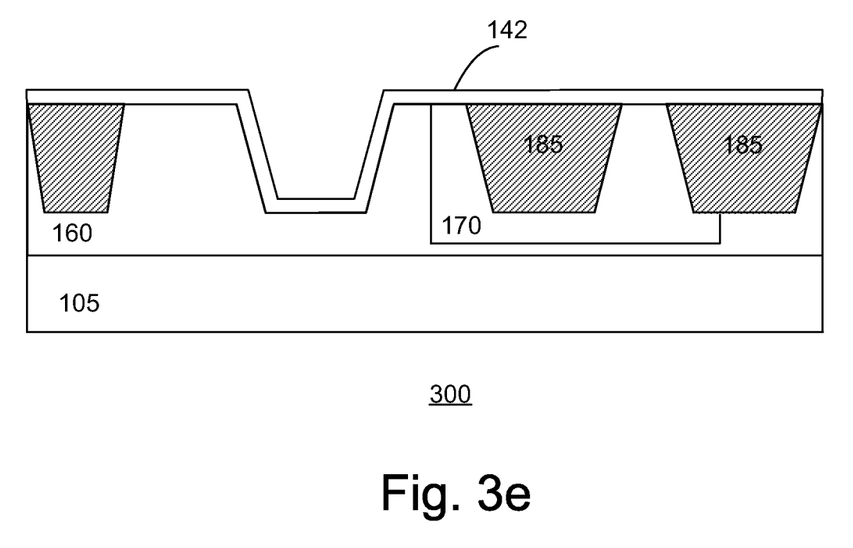

Referring to FIG. 3e, a gate dielectric layer 142 is formed on the substrate. In one embodiment, the gate dielectric layer covers the substrate and lines the channel trench without filling it. The gate dielectric layer, for example, is silicon oxide. Other types of gate dielectric, for example, high voltage gate dielectric, may also be useful. The gate dielectric layer may be formed by thermal oxidation. For example, the dielectric layer is formed by wet oxidation followed by annealing the substrate in an oxidizing ambient. The temperature of the wet oxidation can be, for example, about 600-1000° C. The annealing can be, for example, performed at a temperature of about 1000° C. Forming other types of gate dielectric layers or using other processes may also be useful. The thickness of the gate dielectric is about 20-600 Å. Providing other thicknesses may also be useful.

Figure 3F:
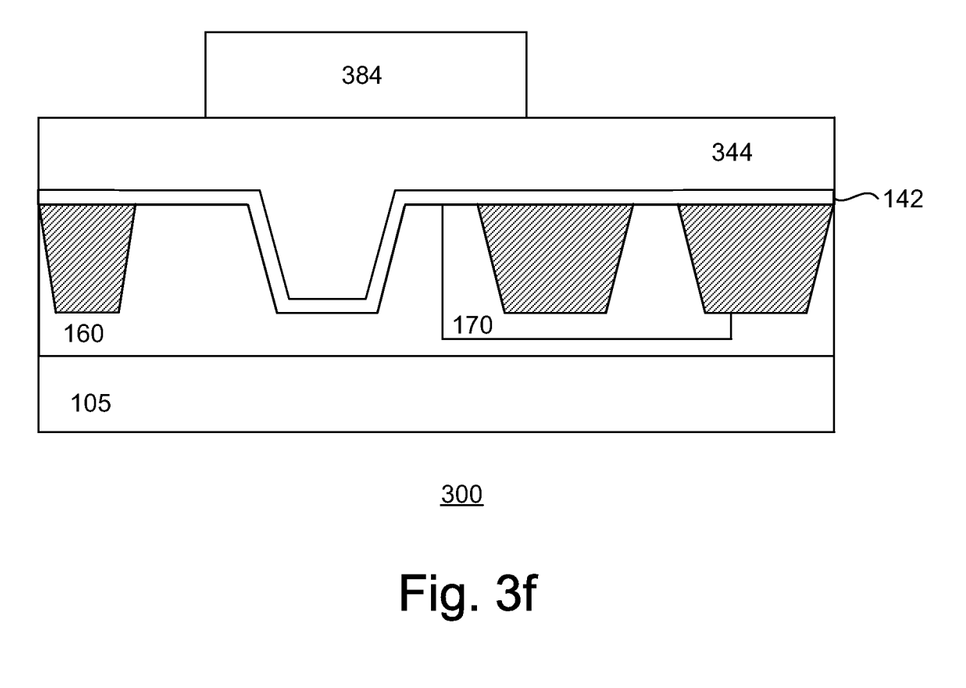

Referring to FIG. 3f, a gate electrode layer 344 is formed on the substrate. In one embodiment, the gate electrode layer is formed over the gate dielectric layer and fills the channel trench. In one embodiment, the gate electrode layer is a silicon layer. The silicon layer, for example, may be a polysilicon layer.

The gate electrode layer may be optionally planarized to form a planar top surface. For example, a chemical mechanical polish (CMP) may be performed to planarize the gate electrode layer. The gate electrode layer may be formed by, for example, CVD. Other techniques for forming the gate electrode layer may also be useful. The gate electrode layer can be formed as an amorphous or non-amorphous layer. In the case of an amorphous layer, an anneal may be performed to form a polycrystalline silicon layer. The thickness of the second portion of the gate electrode layer may be about 500-5000 Å. Other thickness may also be useful.

Other types of gate dielectric and gate electrode materials or thicknesses may also be useful. For example, the gate dielectric material may be a high k dielectric material while the gate electrode may be a metal gate electrode material. Other configuration of gate layers may also be useful. For example, the gate dielectric and/or gate electrode layers may have multiple layers. The layers can be formed by various techniques, such as thermal oxidation, CVD and sputtering.

A mask layer 384 is formed on the substrate. The mask layer, for example, is formed over the gate electrode layer. In one embodiment, the mask layer is a soft mask layer, such as a photoresist layer. An exposure source may selectively expose the photoresist layer through a reticle containing the desired pattern. After selectively exposing the photoresist layer, it is developed to form opening corresponding to location when the gate electrode layer is to be removed. To improve lithographic resolution, an anti-reflective coating (ARC) may be used below the photoresist layer.

In other embodiments, the mask layer may be a hard mask layer. The hard mask layer, for example, may comprise TEOS or silicon nitride. Other types of hard mask materials may also be used. The hard mask layer may be patterned using a soft mask, such as a photoresist.

Figure 3G:
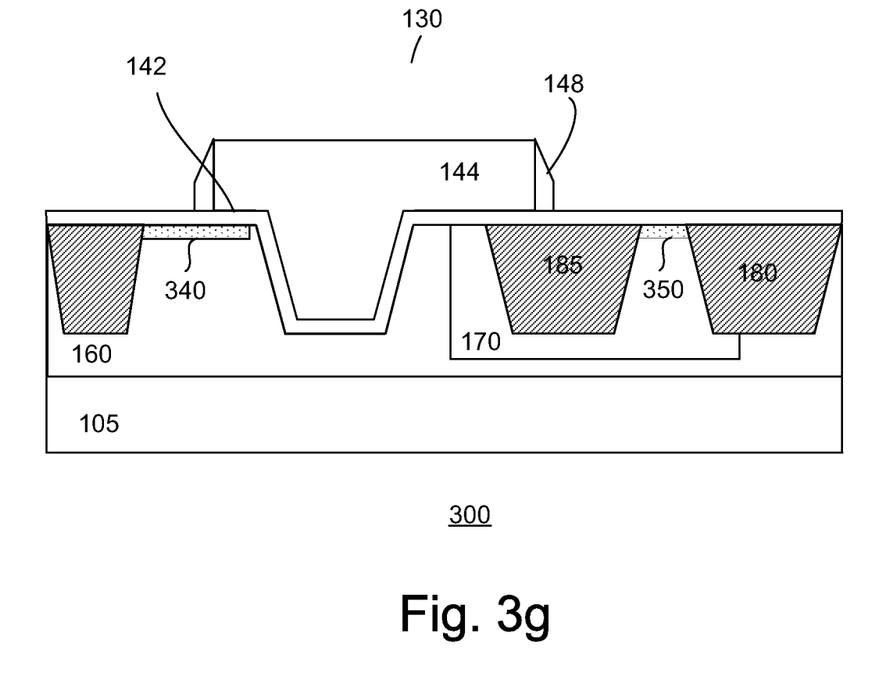

The patterned mask layer serves as an etch mask for a subsequent etch process, as shown in FIG. 3g. For example, the etch transfers the pattern of the mask to the gate electrode layer. The etch removes the gate electrode layer unprotected by the mask, exposing the gate dielectric layer. The etch, for example, may be an anisotropic etch, such as reactive ion etch (RIE). Other types of etch processes may also be useful. In one embodiment, an RIE is employed to pattern the gate electrode layer to form a gate 130 having a gate electrode 144 and gate dielectric 142. The gate, in one embodiment, overlaps the drift well, forming an overlap $O_{gate}$ region. The gate, for example, may be a gate conductor which serves as a common gate for multiple transistors. Other configurations of the gate may also be useful. After the removal of the unprotected gate electrode layer, the patterned mask layer is removed, for example, by wet etch. Other techniques for removing the patterned mask layer may also be useful.

In one embodiment, lightly doped region 340 is formed in the substrate in the source region of the device, as shown in FIG. 3g. The lightly doped region has first polarity type dopants. To form the lightly doped region, first polarity type dopants are implanted into the substrate. The implant, for example, may be self-aligned with respect to the device region. For example, the implant may dope the substrate unprotected by the gate and isolation region. The depth of the lightly doped regions, for example, is about 0.1-0.4 μm. The implant dose may be about 5E12-5E13/cm$^2$ and the implant energy may be about 10-100 KeV. Other implant parameters may also be useful. In one embodiment, forming the lightly doped region in the source region also forms a lightly doped region 350 in the drain region. The implant that forms the lightly doped regions may be self-aligned with respect to the device region. For example, an implant mask which exposes the device region may be provided. The gate and isolation regions provide self-alignment in the device region. The implant mask may be a photoresist layer. Other types of implant masks may also be useful.

Sidewall spacers 148 may be formed on the sidewalls of the gates. To form the sidewall spacers, a dielectric layer is deposited on the substrate. The dielectric layer, for example, may be silicon oxide. Other types of dielectric material, such as silicon nitride, may also be used. The dielectric layer may be formed by CVD. The dielectric layer may also be formed using other techniques. The thickness of the dielectric layer may be, for example, 300-1000 Å. Other thickness for the dielectric layer may also be useful. The thickness, for example, may depend on the desired width of the spacers. An anisotropic etch, such as RIE, may be performed to remove horizontal portions of the dielectric layer, leaving spacers on the sidewalls of the gate. In some applications, the spacer may be formed from multiple dielectric layers.

Figure 3H:
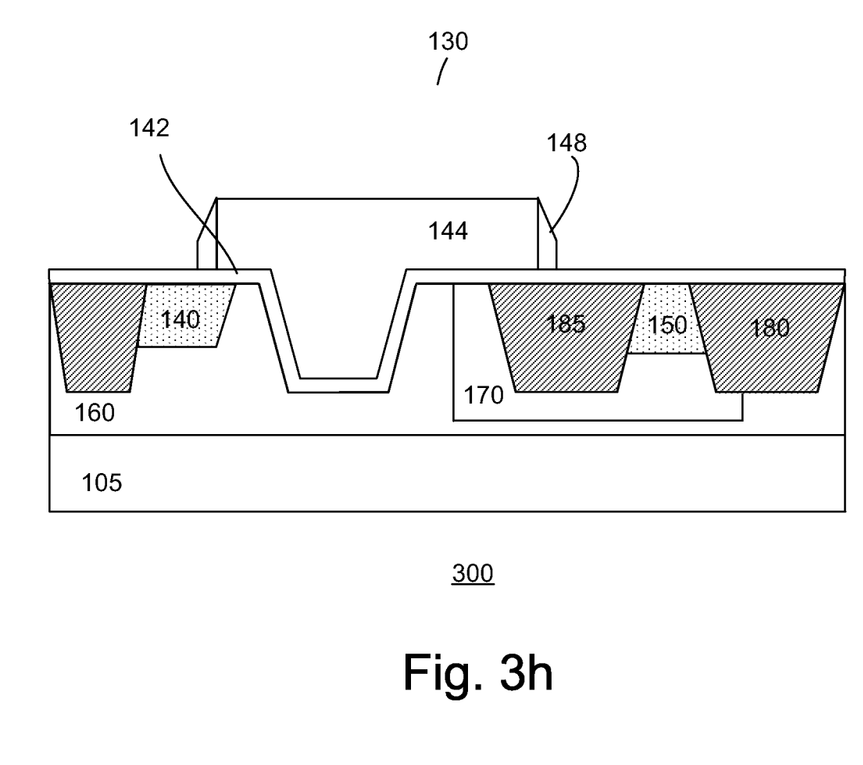

Referring to FIG. 3h, heavily doped regions 140 and 150 are formed in the source and drain regions on the substrate. The heavily doped regions have first polarity type dopants. Forming the heavily doped regions includes implanting first polarity type dopants into the substrate. The implant, like the one that forms the lightly doped regions, is self-aligned with respect to the device region. For example, the dopants may be doped into the substrate unprotected by the gate and isolation regions. In this case, the sidewall spacers cause the heavily doped source region to be offset, creating a source which includes a lightly doped source portion and a heavily doped deeper portion. The depth of the heavily doped regions, for example, is about 0.1-0.4 μm. The implant dose may be about 1E15-1E16/cm$^2$ and the implant energy may be about 10-100 KeV. Other implant parameters may also be useful.

Figure 3I:
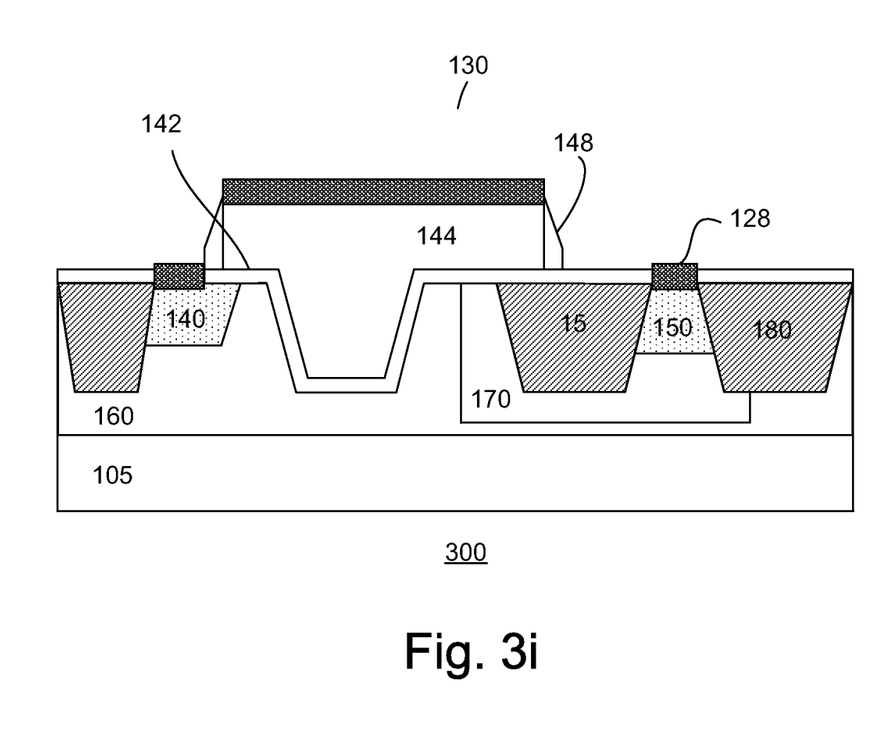

In one embodiment, salicide contacts 128 are formed on contact regions of the device as shown in FIG. 3i. For example, the salicide contacts are formed on the gate and source and drain of the device. The salicide contacts are to facilitate low resistance contacts between the active substrate and the BEOL metal lines. In one embodiment, the thickness of the salicide contacts is about 100-500 Å. Providing other thicknesses may also be useful.

To form the salicide contacts, a metal layer is deposited on the surface of the substrate. The metal layer, for example, may be nickel or an alloy thereof. Other types of metallic layers, such as cobalt, or alloys thereof, including nickel, may also be used. The metal layer can be formed by Physical Vapor Deposition (PVD). Other types of metal elements and/or other types of processes can also be useful.

A first anneal may be performed. The first anneal diffuses the metal dopants into the active substrate, forming a silicided layer. The first anneal, for example, is performed at a temperature of about 300-600° C. for about 10-60 seconds. Excess metal not used in the silicidation of the active surface is removed by, for example, a wet removal process. For example, unreacted metal material is removed selective to the salicide contacts. A second anneal may be performed to enhance the material properties of the silicided layer, for example, lower resistivity. The first and second annealing processes may be a rapid thermal anneal (RTA). Other annealing parameters or techniques may also be useful to form the salicide contacts.

The process continues to form the device. The process may include forming a PMD layer and contacts to the terminals of the transistor as well as one or more interconnect levels, final passivation, dicing, assembly and packaging. Other processes may also be included. For example, other components, such as low voltage, medium voltage, and high voltage I/O devices can be formed prior to forming the interconnections.

The invention may be embodied in other specific forms without departing from the spirit or essential characteristics thereof. The foregoing embodiments, therefore, are to be considered in all respects illustrative rather than limiting the invention described herein. Scope of the invention is thus indicated by the appended claims, rather than by the foregoing description, and all changes that come within the meaning and range of equivalency of the claims are intended to be embraced therein.

What is claimed is:

1. A method of forming a device comprising:
   providing a substrate with a device region; and
   forming a transistor in the device region, wherein the transistor includes
     a gate trench,
     a gate disposed on the substrate and fills the gate trench, the gate having first and second sides along a gate direction,
     a first doped region adjacent to a first side of the gate,
     a second doped region adjacent to a second side of the gate,
     a channel under the gate,
     wherein the channel is along a gate trench direction which is at an angle θ other than 90° with respect to the gate direction, and
     an internal device isolation region along the trench direction in the substrate between the gate and the second doped region.

2. The method of claim 1 wherein angle θ is equal to 45°.

3. The method of claim 1 wherein the substrate comprises top and bottom surfaces.

4. The method of claim 3 wherein the gate trench creates the channel having a first channel direction parallel to the top surface of the substrate and second channel direction along sidewalls of the gate trench.

5. The method of claim 4 wherein the first channel direction is along a (010) plane of the substrate and the second channel direction is along a (001) plane of the substrate.

6. The method of claim 5 wherein forming the transistor comprises forming the gate trench.

7. The method of claim 6 wherein forming the gate trench comprises:
   forming an isolation region along the trench direction; and
   etching the isolation region to form the gate trench, wherein the etching comprises an anisotropic etching.

8. A method of forming a device comprising:
   providing a substrate with a device region;
   forming a transistor in the device region, wherein the transistor includes
     a gate having first and second sides along a gate direction,
     a first doped region adjacent to a first side of the gate,
     a second doped region adjacent to a second side of the gate,
     a channel under the gate, and
     a channel trench in the channel of the gate, wherein the channel trench is along a trench direction which is at an angle θ other than 90° with respect to the gate direction;
   forming an internal device isolation region along the trench direction in the substrate between the gate and the second doped region; and
   forming a drift well in the substrate adjacent to the second side of the gate, the drift well underlaps a portion of the gate with a first edge of the drift well beneath the gate.

9. The method of claim 8 wherein the drift well encompasses the second doped region and internal device isolation region.

10. The method of claim 9 comprises forming an isolation region, wherein the isolation region isolated the device region from other regions of the device.

11. The method of claim 10 comprises forming a device well within the isolation region.

12. The method of claim 11 wherein the device well encompasses the first and second doped region, drift well and internal isolation region.

13. A method of forming a device comprising:
   providing a substrate with a device region, the substrate comprises top and bottom surfaces; and
   forming a transistor in the device region, wherein the transistor includes,
     a gate trench,
     a gate disposed on the substrate and fills the gate trench, the gate having first and second sides along a gate direction,
     a first doped region adjacent to a first side of the gate,
     a second doped region adjacent to a second side of the gate,
     a channel under the gate, wherein the channel is along a gate trench direction which is at an angle θ other than 90° with respect to the gate direction, wherein the gate trench creates the channel having a first channel direction parallel to the top surface of the substrate and second channel direction along sidewalls of the gate trench, and
     an internal device isolation region along the trench direction in the substrate between the gate and the second doped region.

14. The method of claim 13 wherein angle θ is equal to 45°.

15. The method of claim 14 wherein the substrate comprises top and bottom surfaces.

16. The method of claim 15 wherein the first channel direction is along a (010) plane of the substrate and the second channel direction is along a (001) plane of the substrate.

17. The method of claim 16 wherein forming the transistor comprises forming the gate trench.

18. The method of claim 17 wherein forming the gate trench comprises:
   forming an isolation region along the trench direction; and
   etching the isolation region to form the gate trench, wherein the etching comprises an anisotropic etching.

19. A semiconductor device comprising:
   a substrate having a device region; and
   a transistor in the device region, wherein the transistor includes
     a gate trench, a gate disposed on the substrate and fills the gate trench, the gate having first and second sides along a gate direction, a first doped region adjacent to a first side of the gate, a second doped region adjacent to a second side of the gate, a channel under the gate, wherein the channel is along a gate trench direction which is at an angle θ other than 90° with respect to the gate direction, and an internal device isolation region along the trench direction in the substrate between the gate and the second doped region.

* * * * *